(12) United States Patent
Kurusu et al.

(10) Patent No.: US 9,882,551 B2
(45) Date of Patent: Jan. 30, 2018

(54) FREQUENCY MULTIPLIER

(71) Applicant: Mitsubishi Electric Corporation, Tokyo (JP)

(72) Inventors: Hitoshi Kurusu, Tokyo (JP); Takumi Sugitani, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/231,053

(22) Filed: Aug. 8, 2016

(65) Prior Publication Data

US 2017/0149420 A1    May 25, 2017

(30) Foreign Application Priority Data

Nov. 19, 2015  (JP) ................. 2015-226745

(51) Int. Cl.
   *H03B 19/00*    (2006.01)
   *H03K 5/00*    (2006.01)
   *H03H 11/30*    (2006.01)

(52) U.S. Cl.
   CPC ......... *H03K 5/00006* (2013.01); *H03H 11/30* (2013.01)

(58) Field of Classification Search
   CPC .................................. H03K 5/00006
   See application file for complete search history.

(56) References Cited

U.S. PATENT DOCUMENTS

| 5,343,092 A | 8/1994 | Dhong et al. |
| 5,625,205 A * | 4/1997 | Kusama ............. H01L 29/7371 257/197 |
| 7,135,894 B1 * | 11/2006 | Stegers ............ H03K 17/04106 327/108 |

(Continued)

FOREIGN PATENT DOCUMENTS

| JP | Sho63-202107 A | 8/1988 |
| JP | Hei06-029824 A | 2/1994 |
| JP | Hei09-284051 A | 10/1997 |

(Continued)

OTHER PUBLICATIONS

Klaus Fricke et al.; High-Efficiency Frequency Doubling by GaAs Traveling-Wave MESFET's; IEEE Transactions on Electron Devices; vol. ED-34; No. 4; pp. 742-745; Apr. 1987.

(Continued)

*Primary Examiner* — Daniel Puentes
(74) *Attorney, Agent, or Firm* — Studebaker & Brackett PC

(57) ABSTRACT

A frequency includes an input terminal, an output terminal, a transistor having a gate terminal which receives input of a signal including a first frequency from the input terminal, a source terminal and a drain terminal connected to the output terminal by a main line, an output matching circuit provided in the main line, the output matching circuit shutting off the first frequency while allowing an output frequency multiplied from the first frequency to pass therethrough, a branch line including a power supply terminal for connection to a (Continued)

power supply, the branch line branching off from a branch point in the main line, and a first diode provided in the branch line, the first diode having an anode connected to the power supply terminal and a cathode connected on the branch point side.

11 Claims, 6 Drawing Sheets

(56) References Cited

U.S. PATENT DOCUMENTS

2007/0201175 A1* 8/2007 Arai .................... H01L 27/0255
361/56
2013/0088378 A1 4/2013 Kobayashi

FOREIGN PATENT DOCUMENTS

| JP | Sho63-114305 A | 5/1998 |
|---|---|---|
| JP | Hei10-247828 A | 9/1998 |
| JP | 2000-223964 A | 8/2000 |

OTHER PUBLICATIONS

Abdelaziz Hamdoun et al.; Characterization of GaN-Based HEMTs as Varactor Diode Devices; Proceedings of the 10th European Microwave Integrated Circuits Conference; Sep. 7-8, 2015; pp. 417-420.

U. Tietze et al.; Halbleiter-Schaltungstechnik 11th edition; Springer Verlag Berlin Heidelberg New York; May 6, 1999; pp. 303-305; ISBN 3-540-64192-0.

An Office Action issued by the German Patent Office dated Nov. 3, 2016, which corresponds to German Patent Application No. 10 2016 219 769.7 and is related to U.S. Appl. No. 15/231,053; with English language translation.

F. Ellinger et al., "Ultracompact SOI CMOS frequency double for low power applications at 26.5-28.5 GHz", IEEE Microwave and Wireless Components Letters, vol. 14, No. 2, pp. 53-55, Feb. 2004.

D. J. Robinson et al., "1 GSps 11-bit track-and-hold in SiGe BiCMOS", 2005 IEEE Workshop on Microelectronics and Electron Devices, pp. 67-70, Apr. 2005.

Y.S. Lee et al., "A High-Linearity Wideband Power Amplifier With Cascaded Third-Order Analog Predistorters", IEEE Microwave and Wireless Components Letters, vol. 20, No. 2, pp. 112-114, Feb. 2010.

K. Maruhashi et al., "A 60-GHz-band monolithic HJFET LNA incorporating a diode-regulated self-bias circuit", IEEE Transactions on Microwave Theory and Techniques, vol. 45, No. 12, pp. 2256-2260, Dec. 1997.

An Office Action issued by the Korean Patent Office dated Aug. 17, 2017, which corresponds to Korean Patent Application No. 10-2016-0153056 and is related to U.S. Appl. No. 15/231,053; with partial English translation.

* cited by examiner ures 100, 200, 300, 400, 500, and 600

FREQUENCY MULTIPLIER

BACKGROUND OF THE INVENTION

Field

The present invention relates to a frequency multiplier and, more particularly, to a frequency multiplier suitable for use in a microwave or milliwave radiofrequency band.

Background

JP 63-202107 A discloses a single power supply type of amplifier. A transistor provided in this amplifier has a voltage supplied to its drain terminal, not via any voltage drop circuit.

A frequency multiplier, which is a kind of amplifier, has a possibility of failure to supply individual elements with voltages suitable for the elements due to integration of power supplies for the frequency multiplier and peripheral circuits. In such a case, the circuit arrangement of the amplifier disclosed in JP 63-202107 A is incapable of supplying a suitable voltage to the drain terminal.

SUMMARY

The present invention has been implemented to solve the above-described problem and an object of the present invention is to obtain a frequency multiplier capable of setting a drain voltage closer to a suitable value in a case where a power supply voltage is higher than a suitable drain voltage.

The features and advantages of the present invention may be summarized as follows.

According to the present invention, a frequency multiplier includes an input terminal, an output terminal, a transistor having a gate terminal which receives input of a signal including a first frequency from the input terminal, a source terminal and a drain terminal connected to the output terminal by a main line, an output matching circuit provided in the main line, the output matching circuit shutting off the first frequency while allowing an output frequency multiplied from the first frequency to pass therethrough, a branch line including a power supply terminal for connection to a power supply, the branch line branching off from a branch point in the main line; and a first diode provided in the branch line, the first diode having an anode connected to the power supply terminal and a cathode connected on the branch point side.

Other and further objects, features and advantages of the invention will appear more fully from the following description.

DESCRIPTION OF EMBODIMENTS

Figure 1:
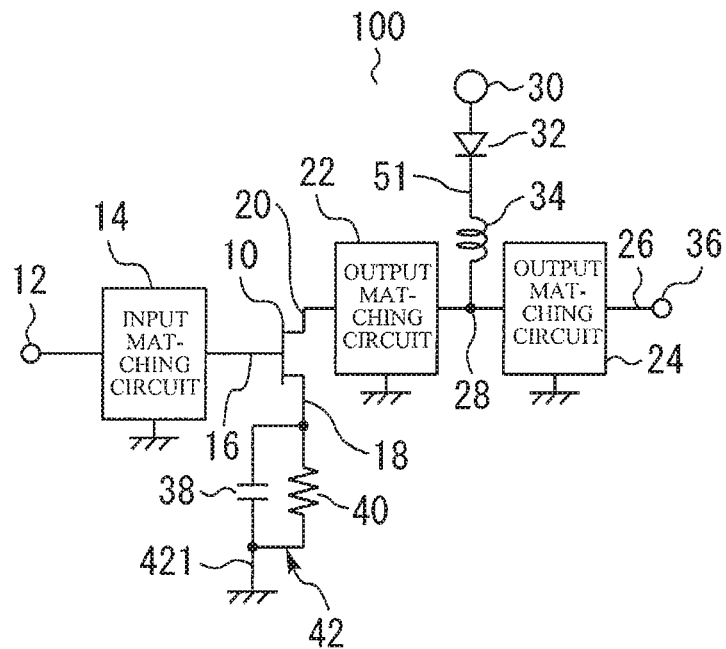
FIG. 1 is a circuit diagram of a frequency multiplier according to the first embodiment of the present invention.

Frequency multipliers 100, 200, 300, 400, 500, and 600 according to embodiments of the present invention will be described with reference to the drawings. Components identical or corresponding to each other are assigned the same reference characters and repeated description of them is omitted in some cases.

First Embodiment

FIG. 1 is a circuit diagram of a frequency multiplier 100 according to the first embodiment of the present invention. An input terminal 12 is connected to one end of an input matching circuit 14. The input matching circuit 14 is grounded. The other end of the input matching circuit 14 is connected to a gate terminal 16 of a transistor 10. A source terminal of the transistor 10 is connected to a self-bias circuit 42. The self-bias circuit 42 has a second capacitor 38 and a second resistor 40 connected in parallel with each other. The self-bias circuit 42 is grounded via a grounding terminal 421. A drain terminal 20 of the transistor 10 is connected to an output terminal 36 by a main line 26.

Output matching circuits 22 and 24 are provided in the main line 26. Each of the output matching circuits 22 and 24 is grounded. A branch line 51 branches off from the main line 26 between the output matching circuits 22 and 24. The point of joining between the branch line 51 and the main line 26 is referred to as a branch point 28. In the branch line 51, the branch point 28 and one end of an inductor 34 are connected. The other end of the inductor 34 is connected to the cathode of a first diode 32. The anode of the first diode 32 is connected to a power supply terminal 30. The power supply terminal 30 is connected to a power supply which supplies a voltage to the drain terminal 20.

The operation of the frequency multiplier 100 according to the present embodiment will subsequently be described. An input signal in a microwave frequency band is input from the input terminal 12. The input signal is a signal including a first frequency f0. The input matching circuit 14 is matched to the first frequency f0. Therefore, a loss caused when input signal is supplied to the gate terminal 16 is limited. A signal having the first frequency f0 is output to the drain terminal 20. Signals having multiplied frequencies nf0 (n=2, 3, 4 . . . ) are also output to the drain terminal 20 due to a nonlinearity of the transistor 10.

The output matching circuit 22 has a function to shut off the first frequency f0. Only the multiplied frequencies nf0 can be extracted while the first frequency f0 is not output from the output terminal 36. Also, the output matching circuit 24 is matched to the multiplied frequencies nf0, which are output frequencies. Therefore, a loss caused when an output signal is extracted from the output terminal 36 is limited.

A voltage is supplied to the drain terminal 20 from the power supply connected to the power supply terminal 30. The first diode 32 is connected to the power supply terminal. The power supply voltage is therefore dropped with the first diode 32 when a current flows through the transistor 10. As a result, the voltage dropped with the first diode 32 is supplied to the drain terminal 20.

The first diode 32 has a parasitic capacitance. The existence of a parasitic capacitance on the branch line 51 side means that a radiofrequency signal on the main line 26 can leak easily into the branch line 51. There is, therefore, a possibility of an output characteristic of the radiofrequency signal extracted from the output terminal 36 being degraded. In the present embodiment, the inductor 34 is provided at the entry to the branch line 51. The inductor 34 has an inductance such as to be regarded as an open end in the microwave frequency band. Leakage of the output signal into the branch line 51 is prevented thereby. As a result, the degradation in the output characteristic due to the parasitic capacitance is limited.

When the transistor 10 is turned on, a current from the drain terminal 20 flows into the source terminal 18. At this time, the source terminal 18 is self-biased with the second resistor 40. The source voltage is adjusted so that the current necessary for the multiplying operation flows through the transistor 10. The source voltage is adjusted by changing the resistance value of the second resistor 40. The second capacitor 38 is provided to ground the radiofrequency signal. The second capacitor 38 has a capacitance such as to be regarded as short circuit in the microwave frequency band.

Figure 2:
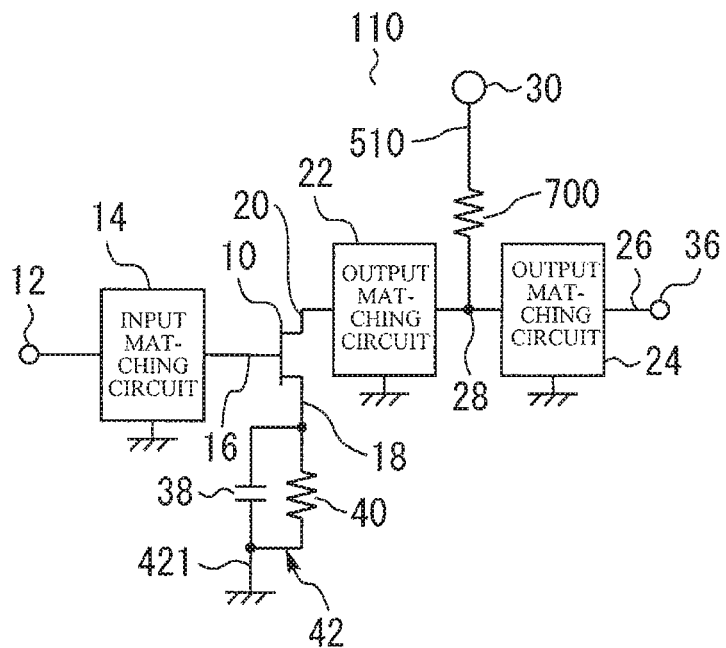
FIG. 2 is a circuit diagram of a frequency multiplier according to a comparative example.

FIG. 2 is a circuit diagram of a frequency multiplier 110 according to a comparative example. The frequency multiplier 110 has a resistor 700 in a branch line 510. When a current flows through the transistor 10, the power supply voltage is dropped with the resistor 700. The voltage dropped with the resistor 700 is therefore supplied to the drain terminal 20. The drain voltage drops in proportion to the resistance value of the resistor 700 and the value of the current flowing through the transistor 10. In general, the current value varies largely in frequency multipliers. The resistor 700 has a resistance value sufficient for dropping the power supply voltage to the suitable drain voltage. The value of the current flowing through the transistor 10 increases with increase in input power. As a result, the drain voltage drops largely from the suitable value.

Figure 3:
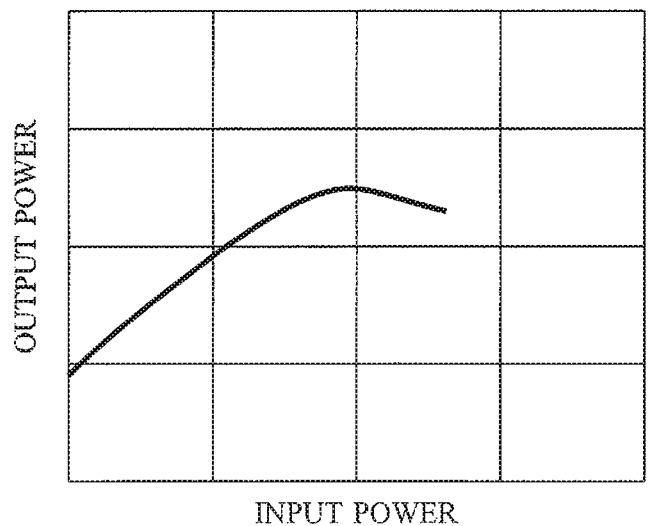
FIG. 3 is a characteristic diagram showing an input to and an output from the frequency multiplier according to the comparative example.

FIG. 3 is a characteristic diagram showing an input to and an output from the frequency multiplier 110 according to the comparative example. As described above, in the case where the power supply voltage is dropped with the resistor 700, the drain voltage drops largely with increase in the current flowing through the transistor 10. As a result, the current flowing through the transistor 10 is limited. Therefore, the output power saturates with increase in input power, as shown in FIG. 3. In the case where the power supply voltage is dropped with the resistor 700, therefore, there is a possibility of failure to obtain sufficiently high output power.

Figure 4:
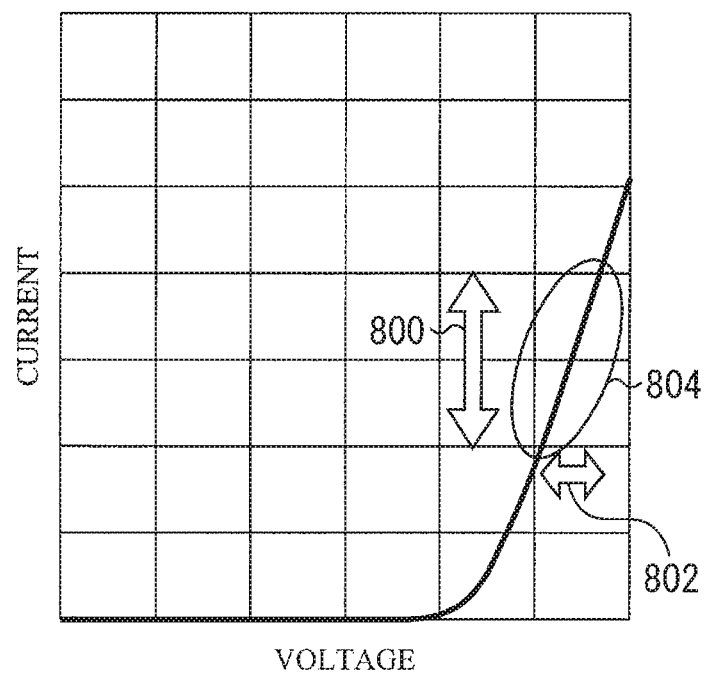
FIG. 4 is a voltage-current characteristic diagram of a first diode according to the first embodiment of the present invention.

On the other hand, in the present embodiment, the first diode 32 is used to drop the power supply voltage. FIG. 4 is a voltage-current characteristic diagram of the first diode 32 according to the present embodiment. The region surrounded by solid line 804 is a region corresponding to a forward-biased state of the first diode 32. In this region, the resistance value of the first diode 32 is low. Accordingly, a change in voltage with respect to a change in current is small, as indicated by arrows 800 and 802. Therefore, a variation in the drain voltage with respect to a variation in the current value is small. A variation in drain voltage due to a variation in the value of the current flowing through the transistor 10 can thus be limited.

Figure 5:
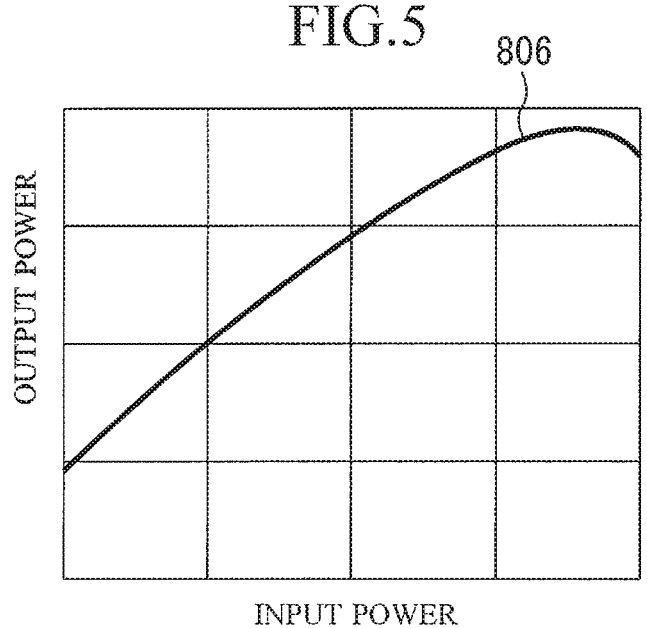
FIG. 5 is a characteristic diagram showing an input to and an output from the frequency multiplier according to the first embodiment of the present invention.

FIG. 5 is a characteristic diagram showing an input to and an output from the frequency multiplier 100 according to the present embodiment. In the case where a voltage drop is caused with the resistor 700, as described above, there is a need to provide the enough resistance value for dropping the power supply voltage to the suitable drain voltage. This means that a drop in the drain voltage with respect to a variation in the current is large. In the case where a voltage drop is caused with the first diode 32, it is caused by the forward voltage of the first diode 32. The resistance value of the first diode 32 in the forward-biased state is low. Use of the first diode 32 therefore enables both dropping the power supply voltage and limiting the drop in the drain voltage with respect to a variation in the current. By limiting the drop in the drain voltage, the reduction in the current flowing through the transistor 10 is limited. As a result, high output power can be obtained, as indicated by solid line 806, in comparison with the case shown in FIG. 3.

In the present embodiment, the frequency multiplier 100 has one first diode 32. A plurality of diodes may alternatively be disposed in series to secure the desired voltage drop. The voltage drop is determined from the difference between the target drain voltage and the power supply voltage. While the input signal in the present embodiment is a signal in a microwave frequency band, a radiofrequency signal such as a milliwave signal can also be used as an input signal.

Second Embodiment

Figure 6:
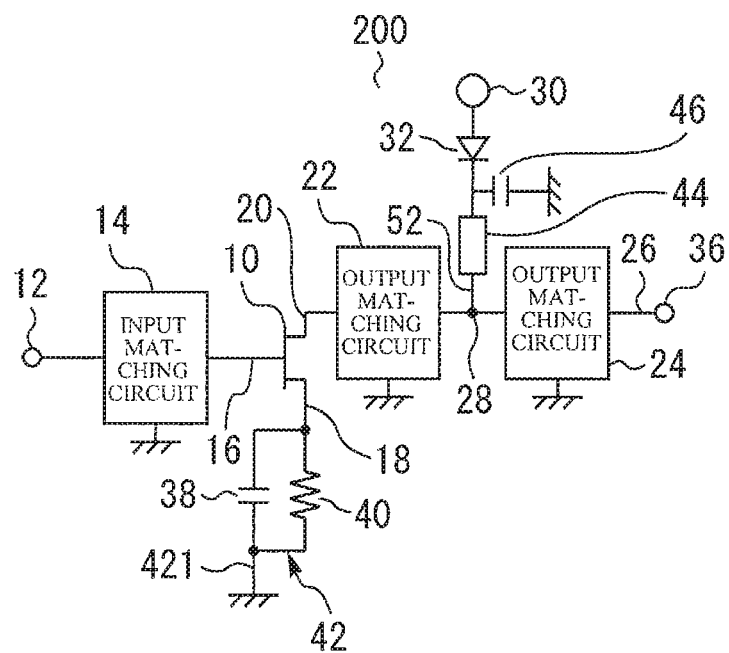
FIG. 6 is a circuit diagram of a frequency multiplier according to the second embodiment of the present invention.

FIG. 6 is a circuit diagram of a frequency multiplier 200 according to the second embodiment. The frequency multiplier 200 has a transmission line 44 which is of ¼ wavelength with respect to the output frequency, and which is provided in a branch line 52. One end of the transmission line 44 is connected to the branch point 28 while the other end of the transmission line 44 is connected to the first diode 32. The branch line 52 is grounded via a first capacitor 46 between the transmission line 44 and the first diode 32. Because of grounding via the first capacitor 46, the first diode 32 side of the transmission line 44 is regarded as a short circuit point in the microwave frequency band. Simultaneously, the branch point 28 side of the transmission line 44 is regarded as an open end. Therefore, leakage of the output signal into the branch line 52 is prevented, as in the first embodiment. The degradation in the output characteristic due to the parasitic capacitance of the first diode 32 is thus limited. The first capacitor 46 has a capacitance such as to be regarded as short circuit with respect to the output frequency.

Third Embodiment

Figure 7:
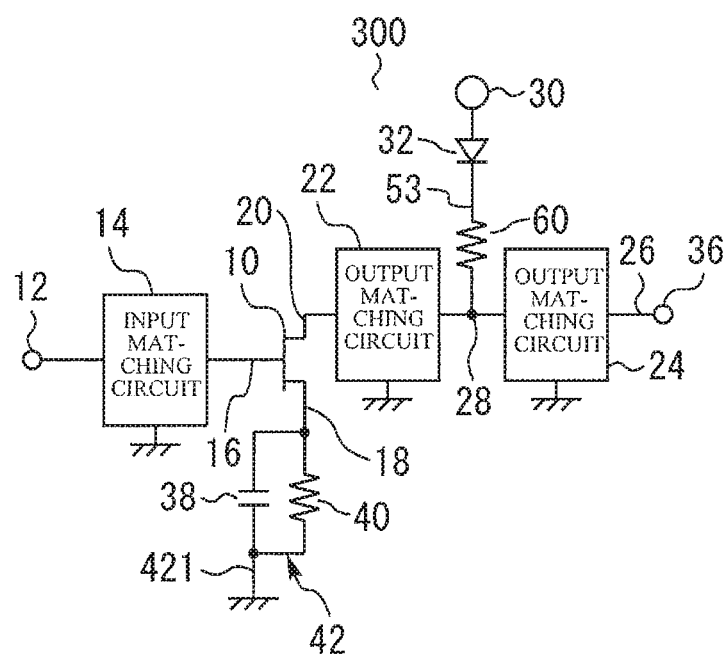
FIG. 7 is a circuit diagram of a frequency multiplier according to the third embodiment of the present invention.

FIG. 7 is a circuit diagram of a frequency multiplier 300 according to the third embodiment. The frequency multiplier 300 has a first resistor 60 in a branch line 53. One end of the first resistor 60 is connected to the branch point 28 while the other end of the first resistor 60 is connected to the first diode 32. In the present embodiment, the performance of dropping the power supply voltage is shared between the first diode 32 and the first resistor 60. In a case where a voltage drop is caused with a resistor, the drain voltage drops largely with variation in current, as described above in the description of the first embodiment. As a result of this, the output power is reduced.

Figure 8:
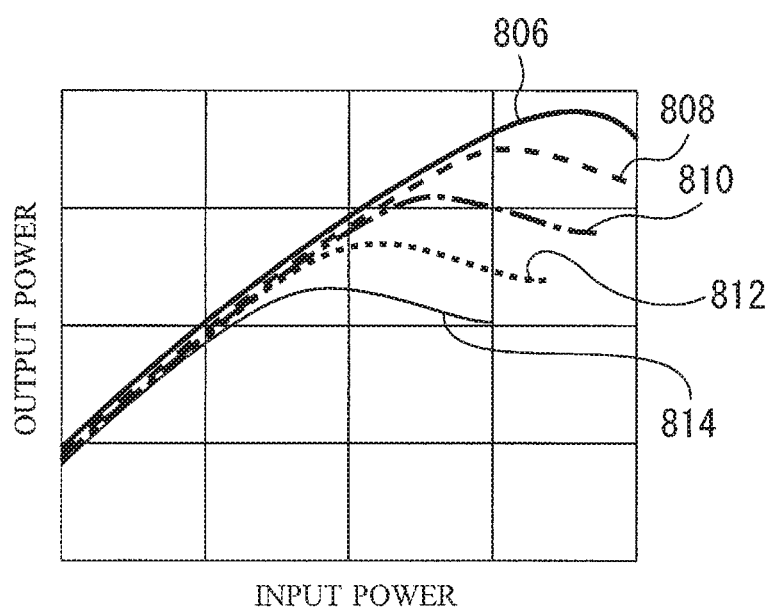
FIG. 8 is a characteristic diagram showing an input to and an output from the frequency multiplier according to the third embodiment of the present invention.

FIG. 8 is a characteristic diagram showing an input to and an output from the frequency multiplier 300 according to the present embodiment. Solid line 806 indicates the output characteristic of the frequency multiplier 100 representing the first embodiment, i.e., the characteristic in the case where a voltage drop is caused with only the first diode 32. Solid line 814 indicates a characteristic in a case where the first diode 32 is not provided and where a voltage drop is caused with only the first resistor 60. Broken line 808, dot-dash line 810 and dotted line 812 indicate output characteristics in a case where the resistance value of the first resistor 60 is changed.

The value of input power at which the output power saturates can be adjusted by adjusting the resistance value of the first resistor 60, as shown in FIG. 8. In the vicinity of the saturated power, a change in output power with respect to a change in input power is small. There is a demand for stabilizing output power with respect to changes in input power in some cases with frequency multipliers. In the present embodiment, a region of input power from which output power can be obtained with stability can be set by adjusting the resistance value of the first resistor 60. Consequently, if the frequency multiplier 300 is operated by the input in such an input region, the output power can be stabilized.

In the present embodiment, the first resistor 60 is provided at the entry to the branch line 53. The first resistor 60 therefore functions as a filter circuit to inhibit entry of the radiofrequency signal. The degradation of the output characteristic due to the parasitic capacitance of the first diode 32 is thus limited. In the present embodiment, there is no need to provide the inductor 34 or the transmission line 44. The frequency multiplier 300 can therefore be reduced in size in comparison with the first and second embodiments.

Fourth Embodiment

Figure 9:
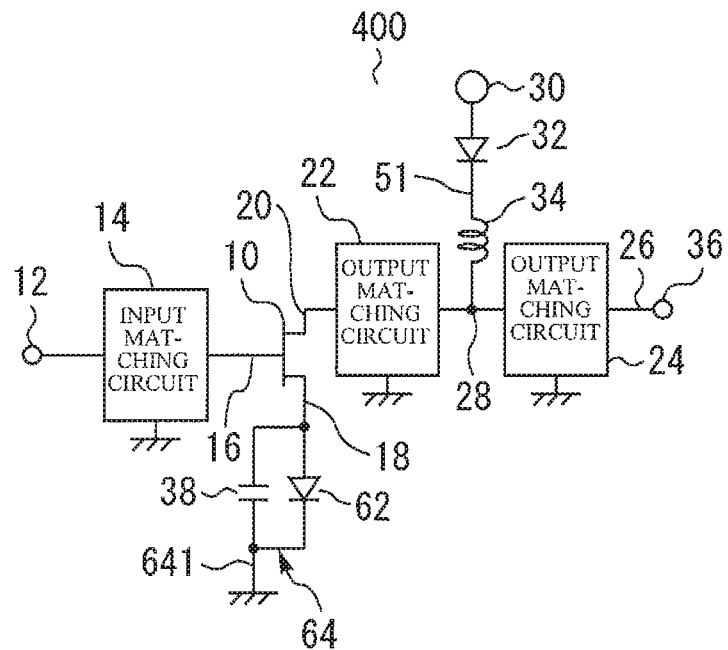
FIG. 9 is a circuit diagram of a frequency multiplier according to the fourth embodiment of the present invention.

FIG. 9 is a circuit diagram of a frequency multiplier 400 according to the fourth embodiment. In this embodiment, the frequency multiplier 400 has a self-bias circuit 64. The self-bias circuit 64 is grounded via a grounding terminal 641. The self-bias circuit 64 has the second capacitor 38 and a second diode 62 connected in parallel with each other. The anode of the second diode 62 is connected to the source terminal 18. The cathode of the second diode 62 is connected to the grounding terminal 641.

While a case where one second diode 62 is provided is illustrated in FIG. 9, a plurality of second diodes are provided in some cases. The number of second diodes is determined so that the initial voltage of the second diodes is higher than the gate-source voltage necessary for the multiplying operation.

The initial voltage of the second diode 62 is higher than the gate-source voltage. Therefore, no current flows through the self-bias circuit 64 when no input signal is supplied. With increase in input power, a voltage rises across the second diode 62 to increase the current value, thereby performing the multiplying operation. In the present embodiment, the operating current when no input is supplied can be reduced, thus enabling power saving.

In the present embodiment, the circuit arrangement shown in the first embodiment and the self-bias circuit 64 are combined. The circuit arrangement shown in the second or third embodiment and the self-bias circuit 64 may alternatively be combined.

Figure 10:
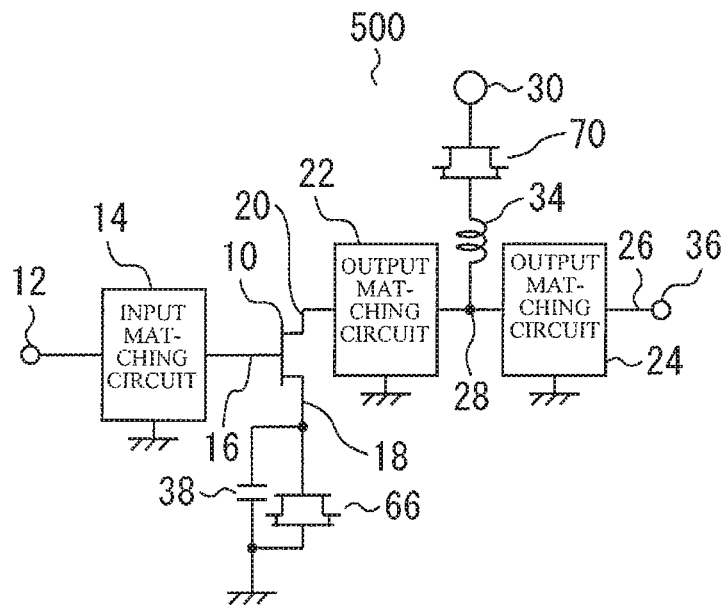
FIG. 10 is a circuit diagram of a frequency multiplier according to a modified example of the fourth embodiment of the present invention.

FIG. 10 is a circuit diagram of a frequency multiplier 500 according to a modified example of the present embodiment. The first diode 32 and the second diode 62 may be replaced with junction transistors 70 and 66 each having its source and drain connected to each other. In this example, the junction transistors 70 and 66 each exhibit a characteristic similar to that of the diode. While both the first diode 32 and the second diode 62 are replaced with transistors in the arrangement shown in FIG. 10, only one of the first diode 32 and the second diode 62 may be replaced with a transistor. Also, each of the first diodes 32 provided in the frequency multipliers 100, 200, and 300 shown in the first, second and third embodiments may be replaced with the junction transistor 70.

Figure 11:
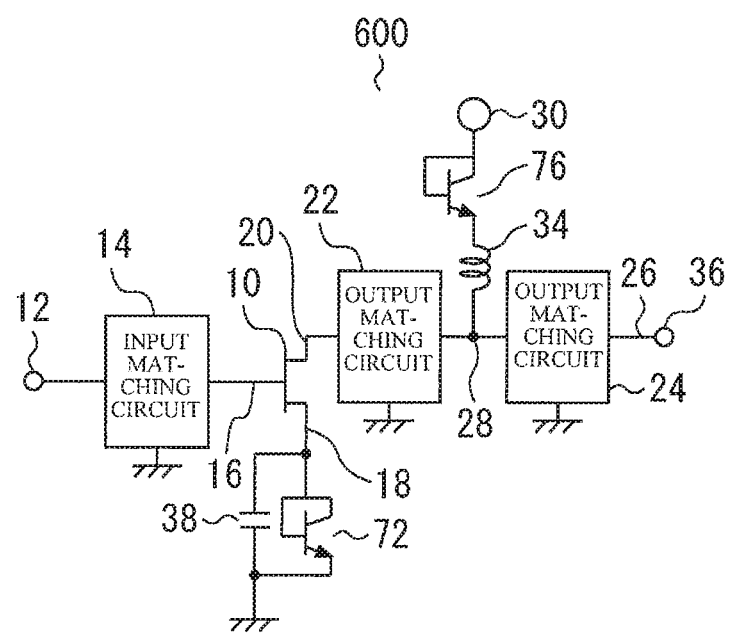
FIG. 11 is a circuit diagram of a frequency multiplier according to a modified example of the fourth embodiment of the present invention.

FIG. 11 is a circuit diagram of a frequency multiplier 600 according to a modified example of the present embodiment. The first diode 32 and the second diode 62 may be replaced with bipolar transistors 76 and 72 each having its base and collector connected to each other. In this example, the bipolar transistors 76 and 72 each exhibit a characteristic similar to that of the diode. While both the first diode 32 and the second diode 62 are replaced with bipolar transistors in the arrangement shown in FIG. 11, only one of the first diode 32 and the second diode 62 may be replaced with a bipolar transistor. Also, each of the first diodes 32 provided in the frequency multipliers 100, 200, and 300 shown in the first, second and third embodiments may be replaced with the bipolar transistor 76.

In the frequency multiplier according to the present invention, the drain terminal is connected to the power supply terminal through the first diode. The power supply voltage is therefore dropped by the forward voltage of the first diode to supply a voltage to the drain terminal. As a result, when the power supply voltage is higher than a suitable drain voltage, a drain voltage can be set closer to the suitable value. The diode has a low resistance in a forward-biased state. Therefore, a variation in the drain voltage with respect to a variation in the current flowing through the transistor is small. Consequently, a variation in the drain voltage due to a variation in the current flowing through the transistor can be limited.

Obviously many modifications and variations of the present invention are possible in the light of the above teachings. It is therefore to be understood that within the scope of the appended claims the invention may be practiced otherwise than specifically described.

The entire disclosure of a Japanese Patent Application No. 2015-226745, filed on Nov. 19, 2015 including specification, claims, drawings and summary, on which the Convention priority of the present application is based, are incorporated herein by reference in its entirety.

The invention claimed is:

1. A frequency multiplier comprising:
    an input terminal;
    an output terminal;
    a transistor having a gate terminal which receives input of a signal including a first frequency from the input terminal, a source terminal and a drain terminal connected to the output terminal by a main line;
    an output matching circuit provided in the main line, the output matching circuit shutting off the first frequency while allowing an output frequency multiplied from the first frequency to pass therethrough;

a branch line including a power supply terminal for connection to a power supply, the branch line branching off from a branch point in the main line;

a first diode provided in the branch line, the first diode having an anode connected to the power supply terminal and a cathode connected on the branch point side; and a filter circuit for inhibiting entry of a radiofrequency signal, the filter circuit being provided between the first diode and the branch point, the filter circuit including a transmission line which is of ¼ wavelength with respect to the output frequency, and a first capacitor for grounding the branch line between the transmission line and the first diode.

2. The frequency multiplier according to claim 1, wherein the first diode is a junction transistor having its source and drain connected to each other.

3. The frequency multiplier according to claim 1, wherein the first diode is a bipolar transistor having its base and collector connected to each other.

4. The frequency multiplier according to claim 1, wherein the gate terminal receives input of a signal including the first frequency through an input matching circuit.

5. The frequency multiplier according to claim 1, wherein the filter circuit includes an inductor.

6. The frequency multiplier according to claim 1, wherein the filter circuit includes a first resistor.

7. The frequency multiplier according to claim 1, further comprising a self-bias circuit with which a voltage of the source terminal is adjusted, the self-bias circuit having a grounding terminal for grounding connected to the source terminal.

8. A frequency multiplier comprising:

an input terminal;

an output terminal;

a transistor having a gate terminal which receives input of a signal including a first frequency from the input terminal, a source terminal and a drain terminal connected to the output terminal by a main line;

an output matching circuit provided in the main line, the output matching circuit shutting off the first frequency while allowing an output frequency multiplied from the first frequency to pass therethrough;

a branch line including a power supply terminal for connection to a power supply, the branch line branching off from a branch point in the main line;

a first diode provided in the branch line, the first diode having an anode connected to the power supply terminal and a cathode connected on the branch point side; and a self-bias circuit with which a voltage of the source terminal is adjusted, the self-bias circuit having a grounding terminal for grounding connected to the source terminal, wherein the self-bias circuit includes a second capacitor and a second resistor connected in parallel with each other.

9. A frequency multiplier comprising:

an input terminal;

an output terminal;

a transistor having a gate terminal which receives input of a signal including a first frequency from the input terminal, a source terminal and a drain terminal connected to the output terminal by a main line;

an output matching circuit provided in the main line, the output matching circuit shutting off the first frequency while allowing an output frequency multiplied from the first frequency to pass therethrough;

a branch line including a power supply terminal for connection to a power supply, the branch line branching off from a branch point in the main line;

a first diode provided in the branch line, the first diode having an anode connected to the power supply terminal and a cathode connected on the branch point side; and a self-bias circuit with which a voltage of the source terminal is adjusted, the self-bias circuit having a grounding terminal for grounding connected to the source terminal, wherein the self-bias circuit includes a second capacitor and a second diode connected in parallel with each other, and wherein the second diode has an anode connected to the source terminal and a cathode connected to the grounding terminal.

10. The frequency multiplier according to claim 9, wherein the second diode is a junction transistor having its source and drain connected to each other.

11. The frequency multiplier according to claim 9, wherein the second diode is a bipolar transistor having its base and collector connected to each other.

* * * * *